US006990647B2

(12) United States Patent
Tseng

(10) Patent No.: US 6,990,647 B2
(45) Date of Patent: Jan. 24, 2006

(54) VARIABLE STAGE RATIO BUFFER INSERTION FOR NOISE OPTIMIZATION IN A LOGIC NETWORK

(75) Inventor: Kenneth Hing Key Tseng, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 116 days.

(21) Appl. No.: 10/078,732

(22) Filed: Feb. 19, 2002

(65) Prior Publication Data

US 2003/0159121 A1 Aug. 21, 2003

(51) Int. Cl.
*G06F 17/50* (2006.01)
(52) U.S. Cl. .................. 716/8; 716/1; 716/6
(58) Field of Classification Search .......... 716/1, 716/2–14; 326/26–31; 327/94, 561
See application file for complete search history.

(56) References Cited

U.S. PATENT DOCUMENTS

| | | | | |
|---|---|---|---|---|
| 5,847,966 A | * | 12/1998 | Uchino et al. | 716/2 |
| 5,986,463 A | * | 11/1999 | Takiguchi | 326/27 |
| 6,117,182 A | * | 9/2000 | Alpert et al. | 716/8 |
| 6,252,418 B1 | * | 6/2001 | Durham et al. | 326/27 |
| 6,351,179 B1 | * | 2/2002 | Ikehashi et al. | 327/541 |
| 2002/0188892 A1 | * | 12/2002 | Lajolo | 714/42 |
| 2003/0117183 A1 | * | 6/2003 | Thibeault et al. | 327/94 |

OTHER PUBLICATIONS

"What is the Appropriate Model for Crosstalk Control?," Lou Sheffer, Cadence Design Systems, 2000 IEEE, pp. 315-320.
"Buffer Insertion for Noise and Delay Optimization," Charles Alpert, et al., IEEE Transactions on Computer-Aided Design on Integrated Circuits and Systems, vol. 18 No. 11, Nov. 1999, pp. 1633-1645.

* cited by examiner

*Primary Examiner*—Vuthe Siek
*Assistant Examiner*—Binh Tat
(74) *Attorney, Agent, or Firm*—Burgess & Bereznak, LLP

(57) ABSTRACT

A buffer for use in a logic circuit comprises input and output nodes. A first inverter having a first device size is coupled to the input node. A second inverter is coupled in series with the first inverter and with the output node. The second inverter having a second device size at least six times greater than the first device size. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims. 37 CFR 1.72(b).

11 Claims, 4 Drawing Sheets

VARIABLE STAGE RATIO BUFFER INSERTION FOR NOISE OPTIMIZATION IN A LOGIC NETWORK

FIELD OF THE INVENTION

The present invention relates to the design of integrated circuits. More specifically, the present invention relates to buffers for use in logic networks.

BACKGROUND OF THE INVENTION

Optimization of delay in global interconnect paths has long been a goal in the design of integrated circuits. A number of algorithms and design techniques have been used to optimize delay and timing slack in designs utilizing submicron device fabrication technologies. With the continued scaling of process technology, however, unwanted capacitive coupling of signals between adjacent interconnect wires on an integrated circuit becomes a very real problem. This phenomenon is referred to as crosstalk. The occurrence of crosstalk on certain operations can cause a chip to malfunction, for example, when a noise glitch is induced on a metal line as a consequence of a fast switching operation on a nearby line.

FIG. 1 shows an analog model for internally induced crosstalk noise during operation of a logic network. Gate 10 drives net 14 that includes a metal interconnect line with resistance modeled as $R_1$–$R_3$. Capacitors $C_1$–$C_4$ represent the capacitive coupling between net 14 and neighboring net 15, which includes gates 11 & 12 and associated physical parameters modeled by resistors $R_4$-$R_8$ and capacitors $C_5$–$C_8$. (It is appreciated that inductive coupling may also be present, although not specifically shown in the figure.) In the context of this discussion, net 14 causes the unwanted interference with net 15 by producing an unwanted noise glitch at the input of gate 12 when the output of gate 10 switches rapidly. In such a model, net 14 is referred to as the aggressor, and net 15, which suffers unwanted interference from the crosstalk-induced glitch, is called the victim. A functional malfunction can occur when the magnitude of the crosstalk-induced glitch is larger than the noise margin at the input node of gate 12 and the resulting glitch propagates to a storage element. When this happens, the logic state of the victim net can flip (e.g., from a logical "1" to a logical "0", or vice-versa).

One common solution to the problem of network malfunctions caused by glitch noise has been insertion of one or more buffers in the victim net. These buffers are typically selected from a standard cell library and function to distribute the capacitive coupling between the newly created wires. The problem with this approach, however, is that significant additional signal delay can be introduced. Furthermore, often times there is no available space in the existing circuit layout for a set of buffer cells to be added. Moreover, because standard cell buffers are usually optimized for propagation delay, the slew rate tends to be sharper on the newly created wire segments where the buffers have been inserted. This can create new noise problems, i.e., where the victim net becomes the aggressor.

What is needed, therefore is a new solution to the existing problem of crosstalk in the design of high performance integrated circuits.

BRIEF DESCRIPTION OF THE DRAWINGS

The present invention is illustrated by way of example, and not limitation, in the figures of the accompanying drawings, wherein.

DETAILED DESCRIPTION

A variable stage ratio buffer for insertion in a logic network is described. In the following description, specific details are set forth, such as device types, sizes, voltage levels, etc., in order to provide a thorough understanding of the present invention. Practitioners having ordinary skill in the semiconductor arts will understand that the invention may be practiced without many of these details. In other instances, well-known elements, device structures, and processing steps have not been described in detail to avoid obscuring the invention.

Figure 2:
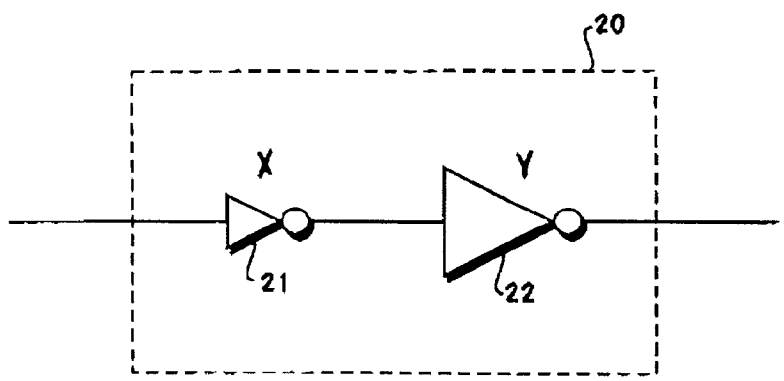
FIG. 2 is a logic diagram of a size-ratioed buffer in accordance with one embodiment the present invention.

FIG. 2 is a logic diagram of a variable stage ratio buffer 20 for use in optimizing noise rejection in an integrated circuit. Buffer 20 comprises a pair of inverters 21 and 22 coupled in series. In one embodiment, each of the inverters are fabricated utilizing conventional complementary metal-oxide semiconductor (CMOS) transistor devices. Other fabrication technologies using different types of devices may also be used.

Figure 1:
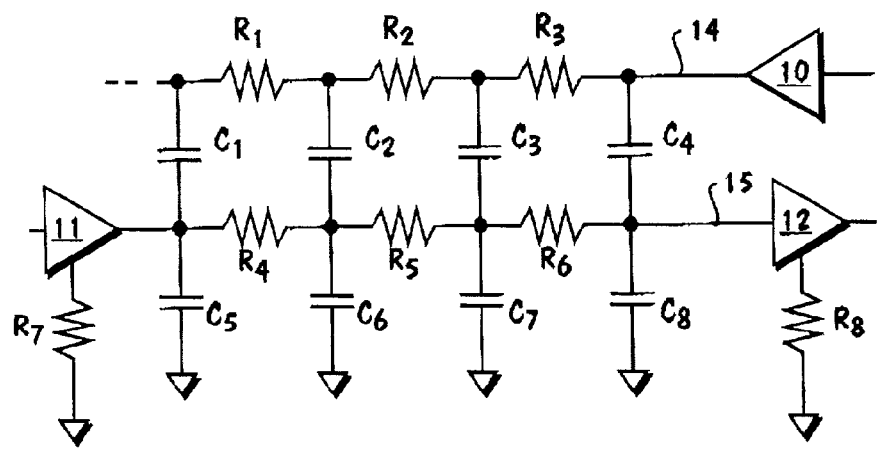
FIG. 1 is a circuit schematic diagram of an analog crosstalk model.

Inverter 21 is denoted in FIG. 1 as having a device size X, with inverter 22 having a device size Y. According to the present invention, a buffer for optimal noise rejection is created by pairing up different sized inverters wherein the stage ratio X:Y exceeds about 1:6. Depending on the magnitude of the crosstalk-induced noise and the available timing slack, the stage ratio may be 1:22 or larger. In a computer-aided circuit design process, appropriately sized buffers 20 may be inserted at selected locations of the circuit layout to combat crosstalk. This aspect of the present invention will be described in more detail shortly.

Figure 3:
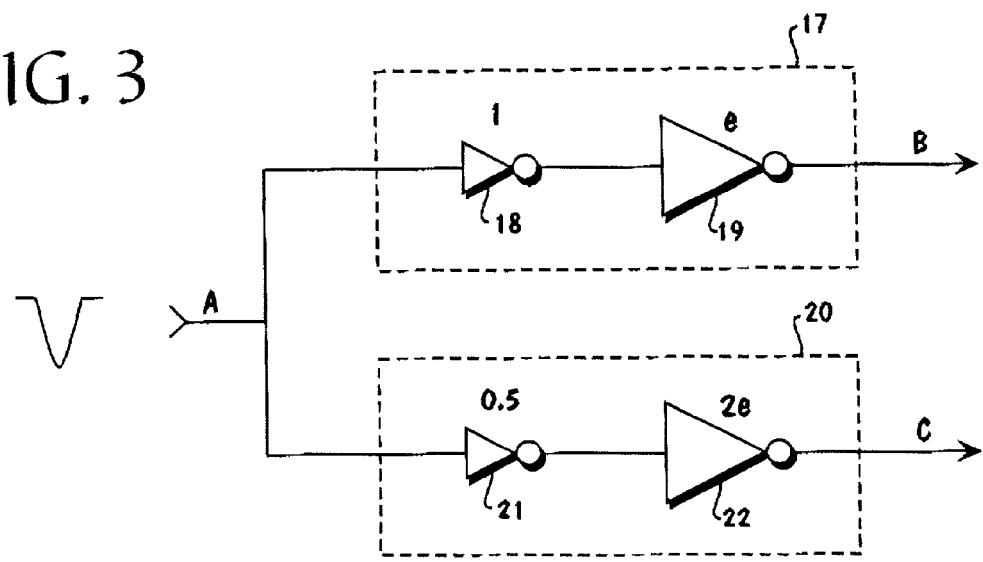
FIG. 3 is a schematic diagram of a circuit used to compare glitch-suppression of two different buffers.

FIG. 3 is logic diagram of a test circuit for comparing the response of buffer 20 of the present invention against a conventional buffer 17 taken from a standard cell library. As shown, buffer 17 comprises a pair of series connected inverters 18 & 19 having a standard device size ratio of 1:e ("e" equals approximately 2.6). According to the present invention, buffer 20 is optimized for noise rejection by increasing the device size of the second stage relative to the first. In practice, the first inverter may be sized down and the second inverter sized up to achieve significant glitch suppression. For example, in the circuit of FIG. 3, the stage ratio of buffer 20 is 0.5:2e (or approximately 1:10). It is appreciated that stage ratio may be varied by appropriate pairing of different sized inverters to achieve optimal noise, delay, and area requirements for a given net.

Figure 5:
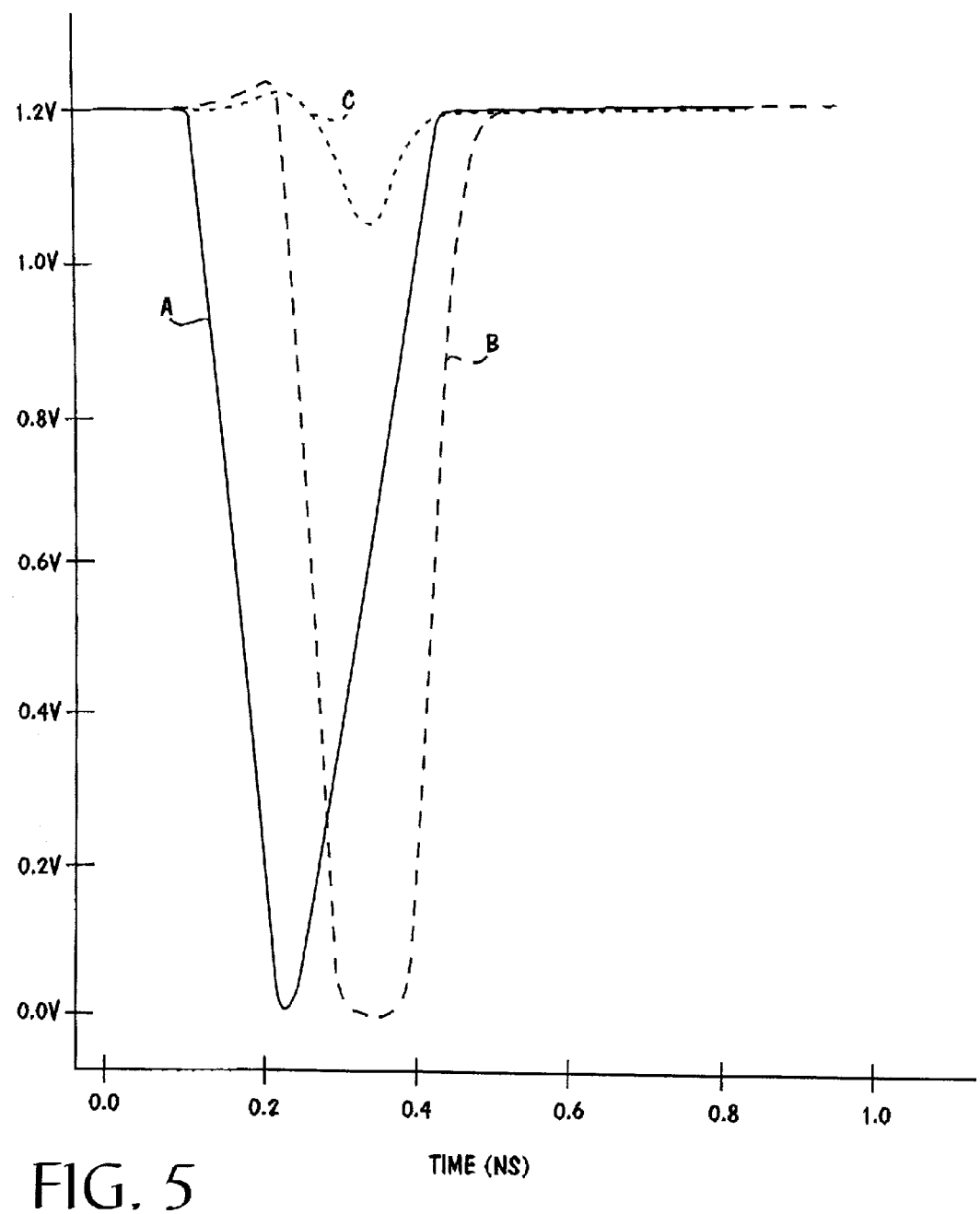
FIG. 5 is a graph showing glitch suppression versus time for a buffer in accordance with one embodiment of the present invention.

FIG. 5 shows a voltage versus time plot of the responses of buffers 17 and 20 to a noise glitch applied simultaneously to each of their inputs. The curve labeled "A" in FIG. 5 represents the noise glitch applied to the inputs of buffers 17 & 20. As can be clearly seen, the noise glitch has a magnitude of about 1.2 volts, which is equal to a full rail-to-rail voltage swing of a typical CMOS logic circuit. The slew rate of curve A is approximately 100 ps/V.

The response curve "B" of the response of standard buffer 17 to the noise glitch exhibits virtually no noise rejection to noise glitch A. In fact, the noise is worsened since the noise glitch is widened, increasing the energy of the glitch. The response curve "C" of buffer 20, on the other hand, shows suppression of noise glitch A from 1.2V to 0.15V, with a slight signal delay of about 50 ps. Thus, according to the present invention, a buffer with a stage ratio of approximately 1:10 may be utilized to suppress a crosstalk-induced noise glitch on a non-critical signal path, or on a critical path where the available timing slack is greater than about 50 ps. Since often times crosstalk glitches tend to occur on non-critical timing paths, buffer 20 may be inserted into a logic network for noise rejection without impacting the overall speed performance of the design.

Figure 4:
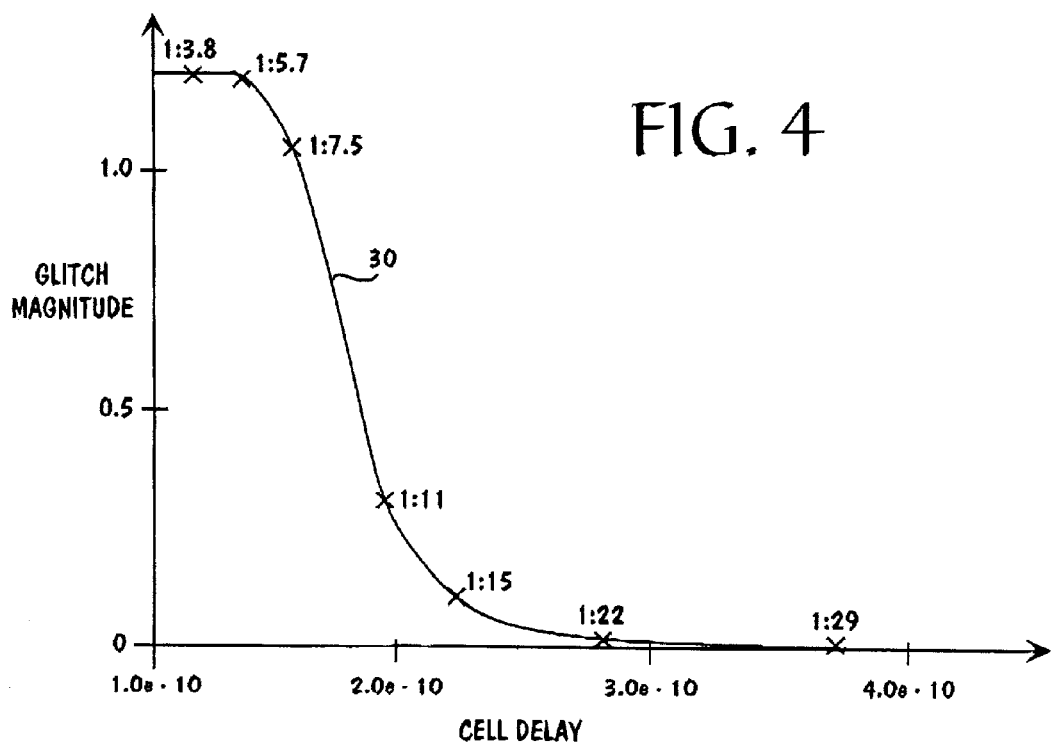
FIG. 4 is a graph plotting glitch magnitude versus delay for various size-ratioed buffers in accordance with the present invention.

FIG. 4 is a plot of noise suppression versus delay for various stage ratios in accordance with the present invention. The curve 30 of FIG. 4 shows the noise suppression versus delay tradeoff that can be achieved utilizing the buffer of the present invention. For example, at stage ratios less than about 1:5, virtually no noise rejection is achieved. That is, a crosstalk-induced glitch of magnitude 1.2V is passed to the output with little or no noise suppression. At a stage ratio of about 1:6 and greater significant noise suppression results. By way of example, at a stage ratio of approximately 1:10, noise glitch suppression is sufficient to satisfy typical noise margin levels with minimal signal delay. The plot of FIG. 4 also illustrates that for non-critical paths, buffers having a much larger (e.g., 1:22) stage ratio may be utilized. In other words, it is appreciated that the stage ratio of the invented buffer may be varied to optimize glitch noise suppression depending on the timing slack available at a particular node in the network.

Figure 7:
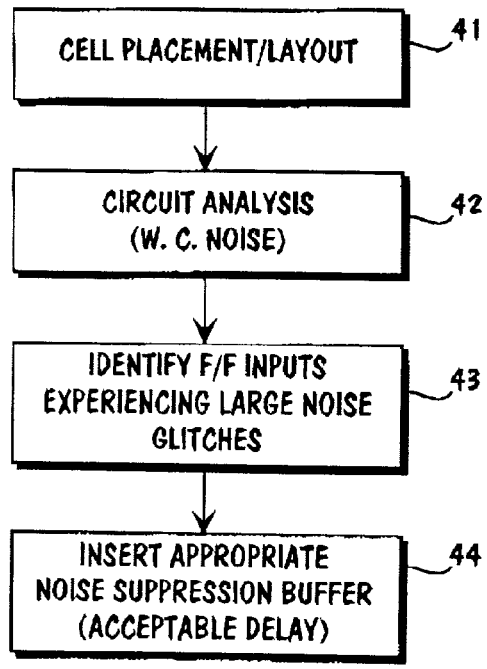
FIG. 7 is flow chart of a computer-aided circuit design method according to one embodiment of the present invention.

In another aspect of the present invention, insertion of a variable stage ratio buffer into a logic network occurs during a computer-aided design process after layout of device cells and interconnects. This point in the process is represented in the flow chart of FIG. 7 by block 41. Following placement of all cells and wires, well-known software tools may be used to extract circuit parameters such as capacitance, inductance, resistance, etc. This parametric information can then be used in conduction with standard analysis tools to identify signal paths prone to crosstalk-induced noise glitches. Extraction and analysis tools may also be used to identify critical timing paths and timing slack available at various nodes within the network. Typically, such analysis is performed assuming worst-case noise conditions, as indicated in block 42.

In one embodiment of the method of the present invention, noise is allowed to propagate until it arrives at the input of a state-preserving device such as a flip-flop, latch, register, or the like. The noise glitch is then analyzed to determine whether it is of a magnitude sufficient to possibly cause a malfunction or functional failure of the circuit (block 43). The available slack in the timing path may also be determined at this point. A noise suppression buffer is then inserted at the input of the state device, as shown by block 44. In one implementation, the buffer is selected with a stage ratio that provides adequate noise suppression without violating any critical timing in the signal path.

Figure 6:
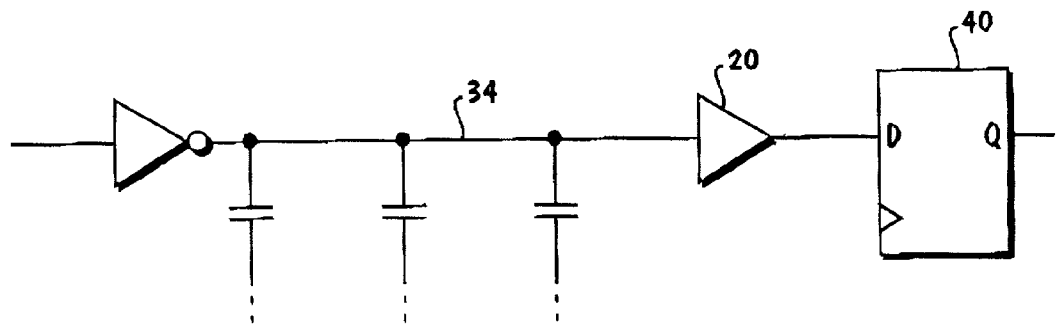
FIG. 6 is a schematic diagram illustrating an example of a circuit design in accordance with one embodiment of the present invention.

FIG. 6 is a circuit diagram illustrating the end result of the above-described method of the present invention. A crosstalk-induced noise glitch is first determined to exist on net 34, propagating to the input of D-type flip-flop device 40. The magnitude of the glitch and the available timing slack at the input node of device 40 is utilized to select a buffer 20 having an appropriate stage ratio to provide sufficient noise suppression with a delay within the available timing margin. In this example, the logic network is modified by the insertion of buffer 20 as close as possible to the input of device 40. Finally, the circuit may optionally be re-analyzed to confirm noise and timing margins have not been violated.

I claim:

1. A computer-aided method for design of a logic network comprising:
   extracting parametric information of a signal path from a layout of the logic network;
   analyzing the logic network to identify a crosstalk-induced glitch at a node of said signal path in the logic network;
   inserting a buffer at the node that functions to suppress a magnitude of the crosstalk-induced glitch, the buffer including first and second inverters coupled in series, the first and second inverters respectively having a device size ratio of 1:6 or larger.

2. The computer-aided method according to claim 1 wherein the parametric information includes capacitance and resistance along the signal path of the logic network.

3. The computer-aided method according to claim 1 wherein the first and second inverters comprise CMOS devices.

4. The computer-aided method according to claim 1 wherein the device size ratio is in a range between 1:8 and 1:22.

5. The computer-aided method according to claim 1 wherein the device size ratio is approximately 1:10.

6. The computer-aided method according to claim 1 wherein the parametric information further includes timing slack available at the node of the signal path.

7. The computer-aided method according to claim 6 wherein the buffer has an associated delay that is smaller than the timing slack available at the node of the signal path.

8. The computer-aided method according to claim 1 wherein the node comprises an input of a logic state device.

9. The computer-aided method according to claim 8 wherein the logic state device comprises a flip-flop.

10. The computer-aided method according to claim 8 wherein the logic state device comprises a latch.

11. The computer-aided method according to claim 8 wherein the logic state device comprises a register.

* * * * *